United States Patent [19]

Fisher et al.

[11] Patent Number: 6,118,398
[45] Date of Patent: Sep. 12, 2000

[54] DIGITAL-TO-ANALOG CONVERTER INCLUDING CURRENT SOURCES OPERABLE IN A PREDETERMINED SEQUENCE AND ASSOCIATED METHODS

[75] Inventors: Gregory J. Fisher, Indialantic; Mario Sanchez; Kantilal Bacrania, both of Palm Bay, all of Fla.

[73] Assignee: Intersil Corporation, Palm Bay, Fla.

[21] Appl. No.: 09/149,154

[22] Filed: Sep. 8, 1998

[51] Int. Cl.[7] .................................................. H03M 1/66
[52] U.S. Cl. ........................................ 341/144; 341/119
[58] Field of Search .................................. 341/144, 118, 341/153, 119

[56] References Cited

U.S. PATENT DOCUMENTS

| | | | |
|---|---|---|---|
| 4,567,463 | 1/1986 | Naylor ..................................... | 341/144 |
| 4,864,215 | 9/1989 | Schouwenaara et al. .............. | 341/119 |
| 5,790,060 | 8/1998 | Tesch ...................................... | 341/119 |
| 5,949,362 | 9/1999 | Tesch et al. ............................ | 341/144 |

OTHER PUBLICATIONS

Product Sheet for Harris Semiconductor HI5760, "*10–Bit, 125/60 MSPS, High Speed D/A Converter*", (Jul. 1998).
Product Sheet for Harris Semiconductor HI5741, "*14–Bit, 100 MSPS, High Speed D/A Converter*", (Mar. 1998).

*Primary Examiner*—Howard L. Williams
*Assistant Examiner*—Jean B. Jeanglaude
*Attorney, Agent, or Firm*—Allen, Dyer, Doppelt, Milbrath & Gilchrist, P.A.

[57] ABSTRACT

A digital-to-analog converter (DAC) includes a plurality of current sources on a substrate operable in a predetermined sequence of use for generating an output current based upon a digital input, and a connection network for establishing the predetermined sequence of use for the current sources based upon the actual current values and to increase performance of the DAC. For example, the predetermined sequence of use can be set to reduce integral non-linearity error of the DAC. The connection network may be provided by a plurality of fusible links selectively connected to set the predetermined sequence of use. The current sources may include a first group of most significant bit (MSB) current sources for a predetermined number of MSBs. In addition, the plurality of current sources may include a second group of mid-most significant bit (mid MSBs) current sources for a predetermined number of mid MSBs. The plurality of current sources have actual values sortable from lowest to highest, and each actual current value will define an error value with both a magnitude and polarity relative to the desired value. One embodiment for sorting the order of use of the current sources is based upon the error values.

40 Claims, 6 Drawing Sheets

DIGITAL-TO-ANALOG CONVERTER INCLUDING CURRENT SOURCES OPERABLE IN A PREDETERMINED SEQUENCE AND ASSOCIATED METHODS

FIELD OF THE INVENTION

The present application relates to the field of electronic circuits, and, more particularly, to a digital-to-analog converter (DAC) and related methods.

BACKGROUND OF THE INVENTION

Digital-to-analog converters are widely used for converting digital signals to corresponding analog signals for many electronic circuits. For example, a high resolution, high speed digital-to-analog converter (DAC) may find applications in cellular base stations, wireless communications, direct digital frequency synthesis, signal reconstruction, test equipment, high resolution imaging systems and arbitrary waveform generators, for example.

An integrated circuit DAC is described, for example, in U.S. Pat. No. 3,961,326 to Craven entitled "Solid State Digital to Analog Converter". The DAC includes binarily scaled constant current sources with associated switch cells employing bipolar transistors to direct the bit currents either to a current summing bus or to ground. Unfortunately, the DAC may be susceptible to errors as caused by switching glitches. In addition, the current sources may have values which differ from the intended value. The current sources may be non-uniform for various reasons, such as circuit layout mismatch, thermal distribution, and/or process variations.

There have been attempts to further reduce glitch, for example, in a DAC and thereby reduce harmonic distortion and other undesired signals in the output spectrum. For example, a DAC for video applications is disclosed in an article entitled "A Low Glitch 10-bit 75-MHz CMOS Video D/A Converter" by Wu et al. in the IEEE Journal of Solid-State Circuits, Vol. 30, No. 1, January 1995. The DAC includes a segmented anti-symmetric switching sequence and an asymmetrical switching buffer. The DAC includes a large number of non-weighted current sources for the seven most significant bits, and weighted current sources for the three least significant bits.

Another DAC is disclosed in an article by Bastiaansen et al. entitled "A 10-b 40-MHz 0.8-um CMOS Current-Output D/A Converter" in IEEE Journal of Solid-State Circuits, Vol. 26, No. 7, July 1991. The DAC is based on current division and current switching. Monotonicity of the converter requires that the integral non-linearity (INL) be less than ±0.5 LSB. Unfortunately, this places high demands on upon the matching of the current sources. An article entitled "A 16-b D/A Converter with Increased Spurious Free Dynamic Range" by Mercer in the IEEE Journal of Solid-State Circuits, Vol. 29, No. 10, October 1994, pp. 1180–1185 discloses another DAC. The article identifies the two broad categories of errors or distortion in digital-to-analog conversion. Segmentation of the bits and laser trimming of thin film resistors are often used to minimize static errors. Dynamic or AC errors include nonlinear settling, ringing, non-symmetric slew, and glitch. Thermometer decoding of the most significant bits along with high-speed process technologies are often employed to minimize the dynamic errors. Segmentation of the four most significant bits into 15 currents of equal size is disclosed. Laser trimmable thin-film resistors are used in the DAC current sources to allow trimming to reduce linearity errors.

Unfortunately, despite continued improvements in DAC operating speed and accuracy, factors may still significantly effect the linearity of the DAC. For example, non-uniformity of the current sources may adversely affect the linearity of the DAC. One approach to achieve higher accuracy will suffer a reduced die yield. Unfortunately, the cost of each DAC may be greatly increased as yields are reduced.

SUMMARY OF THE INVENTION

In view of the foregoing background, it is therefore an object of the present invention to provide a DAC and associated methods resulting in increased performance for the DAC despite non-uniformity of the current sources of the DAC.

These and other objects, advantages and features in accordance with the present invention are provided by a DAC including a plurality of current sources operable in the predetermined sequence of use for generating an output current based upon a digital input, and a connection network for establishing the predetermined sequence of use for the current sources based upon the actual current values and to increase performance of the DAC. For example, the predetermined sequence of use can be set to reduce integral non-linearity error (INL) of the DAC. The connection network may be provided by a plurality of fusible links selectively connected to set the predetermined sequence of use. Accordingly, the present invention provides better performance than would otherwise be obtained without accounting for and reordering the sequence of use of the current sources, since the current sources will have slightly different output values due to process or manufacturing variations, for example.

In particular, the plurality of current sources may comprise a first group of most significant bit (MSB) current sources for a predetermined number of MSBs. The predetermined number of MSBs may be N and the first group of MSB current sources are then $2^N-1$ in number. These are typically $2^N$ MSB current source, of which only $2^N-1$ are used. In addition, the plurality of current sources may comprise a second group of mid-most significant bit (mid MSB) current sources for a predetermined number of mid MSBs. The predetermined number of mid MSBs may be M and the second group of mid MSB current sources are then $2^M-1$ in number. The number of MSBs may be five and the number of mid MSBs may be four, for example.

The first group of MSB current sources define a mean MSB current source value. Accordingly, the second group of mid MSB current sources may be selected to generate a total current substantially equal to $(2^M-1)/2^M$ times the mean MSB current source value. In other words, the second group may be selected from one of the MSB current sources, and, preferably, a MSB current source which has near the mean current value and which was not used for the MSB current sources.

The plurality of current sources have actual values sortable from lowest to highest, and each actual current value will define an error value with both a magnitude and polarity relative to the desired value. An access network or means may be provided to facilitate measuring of the individual current source values.

One embodiment for sorting the order of use of the current sources is based upon the error values. In other words, in one embodiment, the connection network establishes a predetermined sequence of use of the current sources defining a first current source with a first polarity and an error magnitude of about half a largest or highest error magnitude, followed by a second current source having a second polarity and a highest magnitude, with the remaining current sources ordered so that the error alternates from the first polarity to the second polarity and the magnitude of the error decreases from largest to smallest and then back again from smallest to largest. A last current source has about half a largest or highest magnitude of error and the first polarity.

A method aspect of the invention is for making a DAC comprising the steps of forming a plurality of current sources on a substrate operable in a predetermined sequence of use for generating an output current based upon a digital input, each current source having an actual current value statistically related to a desired current value; and determining the predetermined sequence of use for the plurality of current sources based upon the actual current values and to increase performance of the DAC. Of course, the method may also include the step of setting a connection network to establish the predetermined sequence of use for the plurality of current sources.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

Figure 1:
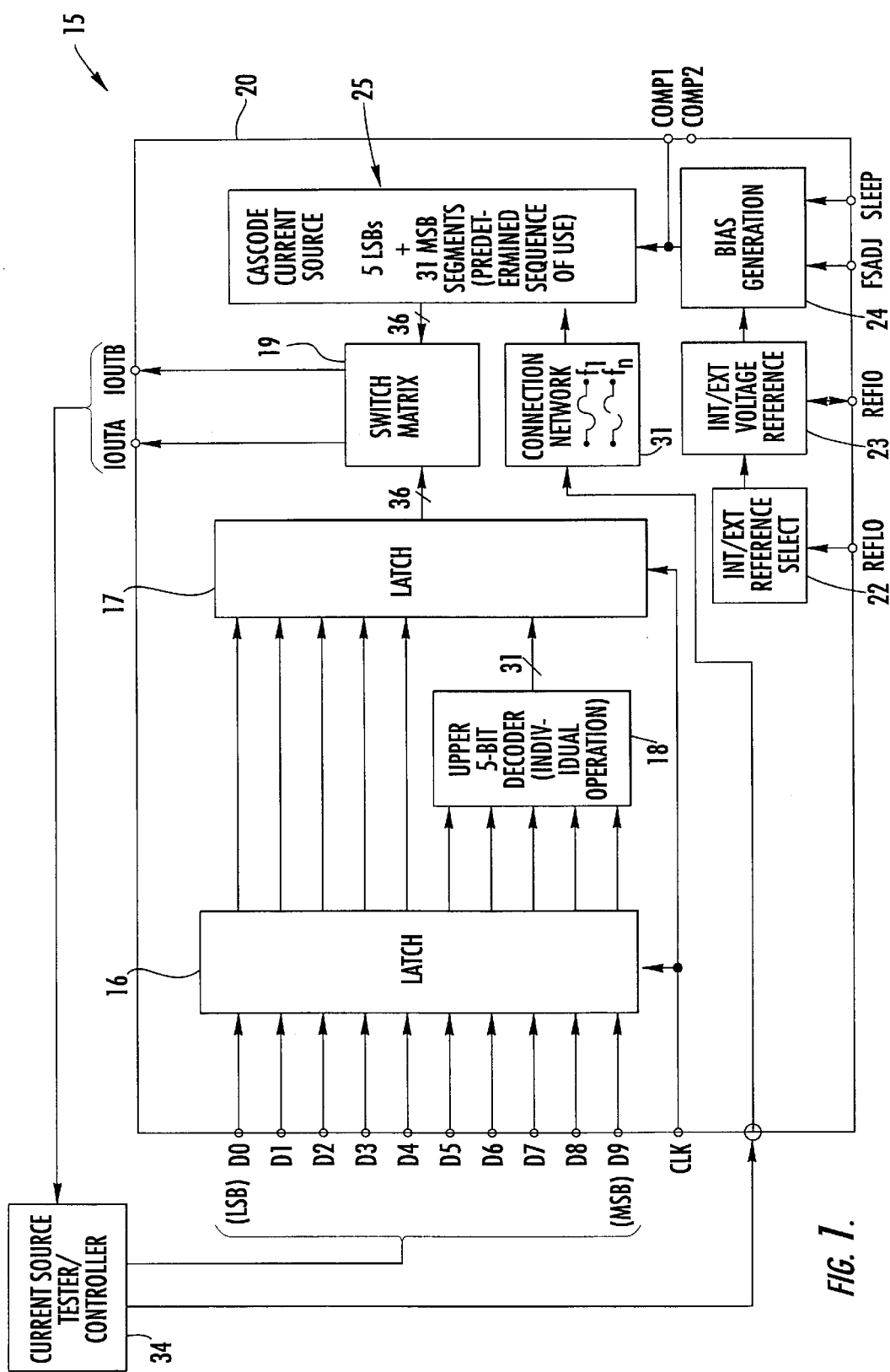
FIG. 1 is a functional block diagram of a DAC in accordance with the present invention.

The major components of the DAC 15 in accordance with the present are first explained with reference to FIG. 1. The illustrated DAC 15 is a 10-bit DAC including ten inputs D0–D9 which are fed to the illustrated first latch 16. The outputs of the first latch are coupled to a second latch 17 and the illustrated upper 5-bit decoder 18. The decoder 18 is also equipped with additional decoder circuitry in one embodiment to permit a determination or measurement of the individual current source values as described below in greater detail.

An internal/external reference select circuit 22 is coupled to an internal external/external voltage reference circuit 23 which, in turn, is coupled to the illustrated bias generation circuit 24. The external pin REFLO permits selecting the internal or an external reference. The external voltage reference, if selected, is provided on pin REFIO. The bias generation circuit 24 permits a full scale current adjustment via pin FSADJ as will be readily appreciated by those skilled in the art. The SLEEP pin permits power down of the DAC as will also be readily appreciated by those skilled in the art. In the illustrated embodiment, the DAC 15 is an integrated circuit formed on a substrate 20.

The illustrated DAC 15 is based upon a conventional 10-bit CMOS DAC Model HI5760 available from assignee of the present invention. This DAC is further described in the Harris Semiconductor HI5760 product brochure dated July 1998, the entire disclosure of which is incorporated herein by reference.

The illustrated DAC 15 also includes a block of current sources 25, which illustratively includes binarily weighted currents sources for the five least significant bits (LSBs) as well as thirty-one current sources of the five MSBs. The block of current sources 25 is connected to the illustrated switch matrix 19 to provide an output current based upon the digital signal received on the inputs D0–D9.

Figure 2:
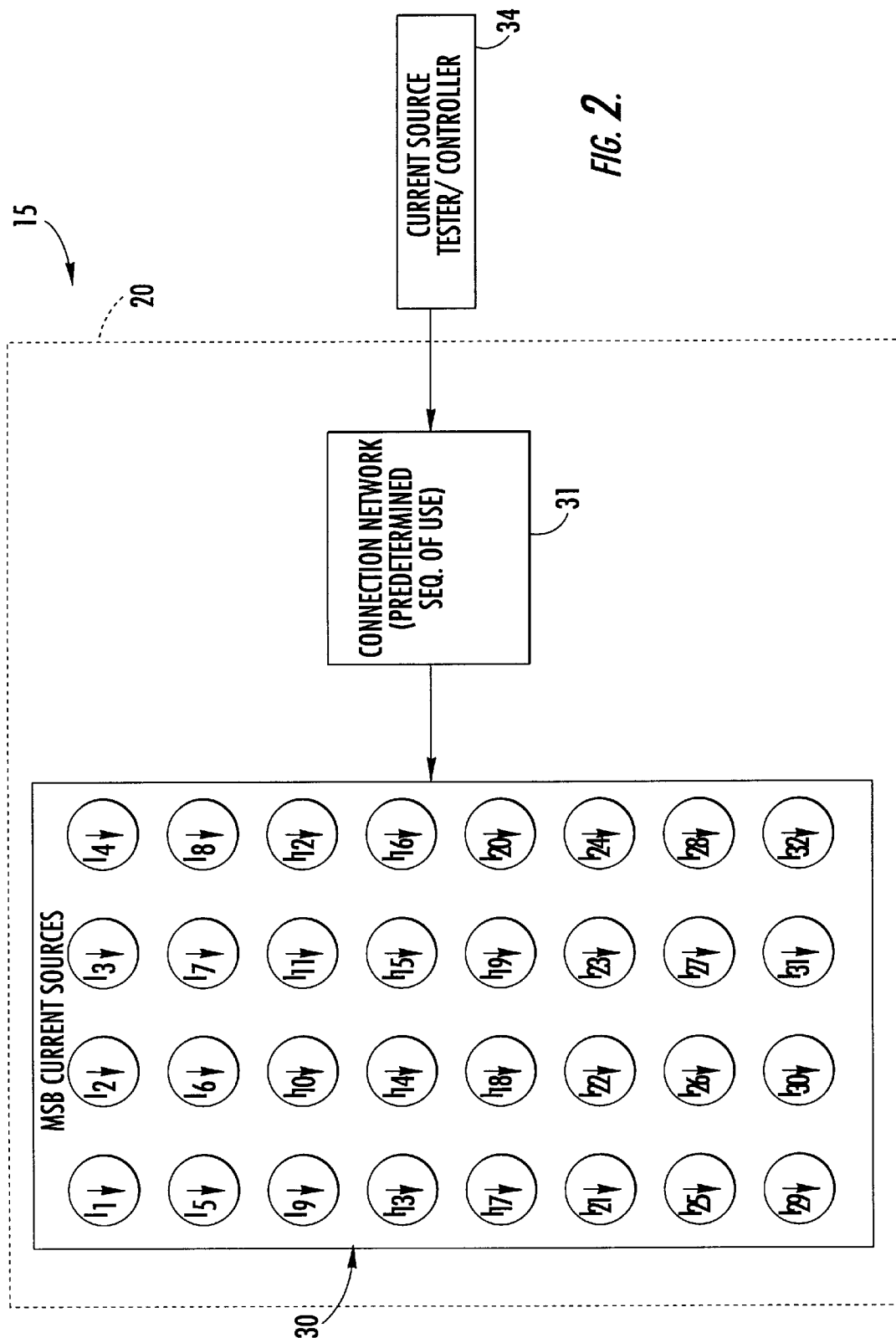
FIG. 2 is a more detailed schematic diagram of a MSB current source portion of the DAC as shown in FIG. 1.

Referring now additionally to FIG. 2, the DAC 15 includes a first group or bank 30 of MSB current sources I1–I32 on the substrate 20. In particular, in the illustrated embodiment, thirty-two MSB current sources I1–I32 are shown, although only thirty-one are used for the five MSBS. Of course, those of skill in the art will appreciate other arrangements in the number of current sources based upon the number of MSBs. In particular, the predetermined number of MSBs may be N and the first group of MSB current sources I1–I32 are then $2^N-1$ in number.

Because process variations and other factors may affect the uniformity of the MSB current sources I1–I32, the present invention provides that these MSB current sources are operable in a predetermined sequence of use for generating an output current based upon a digital input to provide better DAC performance. Each of the MSB current sources I1–I32 has an actual current output value which is statistically related to the desired current output value. The DAC 15 includes the illustrated connection network 35 for establishing the predetermined sequence of use for the MSB current sources I1–I32 based upon the actual current values and to increase performance of the DAC.

For example, the predetermined sequence of use can be set to reduce integral non-linearity error (INL) of the DAC. The INL is a measure of the worst case point that deviates from a best fit straight line of data values along the transfer curve of the DAC 15 as will be readily appreciated by those skilled in the art. The differential non-linearity error (DNL) could also be the parameter sought to be enhanced by the predetermined order of the current sources. As will also be appreciated by those skilled in the art, the DNL is a measure of the step size output deviation from code to code. Ideally the step size should be one LSB, and, accordingly a DNL specification of one LSB or less guarantees monotonicity.

The connection network 35 may be provided by a plurality of fusible links f1–fn selectively connected to set the predetermined sequence of use. Of course, transistors, switches, or other components could also be used for the connection network 35.

In the illustrated embodiment, a current source tester/controller 34 is used to both test or determine the actual current source value for each MSB current source, and then cause the connection network 35 to be set to operate the current sources in the predetermined sequence as will be described in greater detail below. The test and control functions could be provided by separate devices in other embodiments as will be understood by those skilled in the art.

Figure 3:
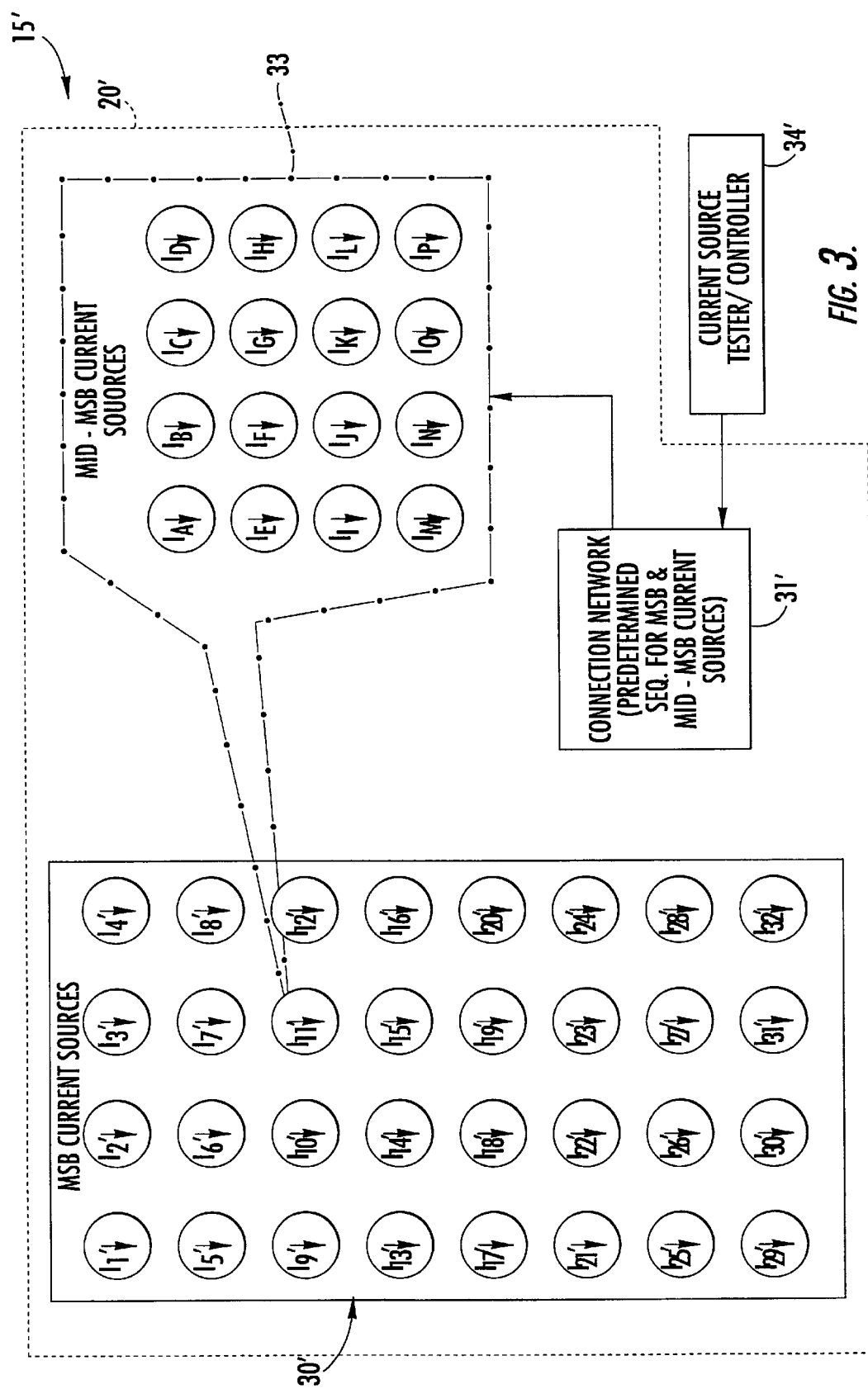
FIG. 3 is another embodiment of a MSB current source and mid MSB current source portion of a DAC in accordance with the present invention.

Turning now to FIG. 3, another embodiment of the DAC 15' in accordance with the invention is described. This DAC 15' is a 14-bit DAC, and accordingly adopts the principles of the invention relating to reordering of the current sources also to the four mid MSBs. More particularly, in this embodiment the plurality of current sources also comprises a second group or block 33 of mid-most significant bit (mid MSB) current sources IA–IP for four mid MSBs. In the illustrated embodiment, fifteen of sixteen possible mid MSB current sources are used. Of course, other numbers of mid MSBs may be used. The predetermined number of mid MSBs may be M and the second group of mid MSB current sources are then $2^M-1$ in number.

An important feature of the present invention is that each MSB current source I1–I32 may have a current value that is a multiple, such as sixteen in the illustrated embodiment, of the current value of the mid MSB current source IA–IP. In other words, each MSB current source may comprise sixteen current sources having their outputs summed together as will be readily appreciated by those skilled in the art. Moreover, the first group of MSB current sources will define a mean MSB current source value. Accordingly, the second group of mid MSB current sources may be provided by the non-used MSB current source, itself comprising sixteen current sources, and which has a value closest to the mean value of the MSB current sources I1–I32.

Of course, in other embodiments, an MSB current source selected for the mid MSBs need not be the MSB current source closest to the mean value. Moreover, the principles of reordering for better performance may be used for the mid MSB current sources IA–IP. These mid MSB current sources would be reordered to a predetermined sequence of use by the connection network 35' as described in greater detail below. Those other elements of the DAC 15' of FIG. 3 include similar elements to those described above in detail with respect to FIGS. 1 and 2. Accordingly, these other elements shown in FIG. 3 need no further description herein.

As will be readily appreciated by those skilled in the art, a primary performance specification of a DAC is the integral non-linearity error (INL). The INL is mainly dependent on the degree of matching between the PMOS current sources for a CMOS DAC, for example. More particularly, in a prior art DAC, such as the Harris HI5760, the INL is limited to about the 11 or 12 bit level.

A common architecture used for a DAC at the 10-bit level (and one that allows easy expansion up to the 14-bit level) is a segmented architecture using 5 MSBs, 4 mid MSB, and a group of LSBs which number from 1 in the 10-bit case, to 5 in the 14-bit case. The 14-bit DAC 15' is described above. For any particular integrated circuit die that is manufactured, even though the thirty-one MSB current sources I1–I32 are intended to be identical they will actually have some statistical variation around the nominal current value. As a group, the MSB current sources will have a unique current level. This difference in current levels is the mismatch which will limit INL, and, hence, limit die yield to a given INL specification level.

In prior art, the order of use of the thirty-one MSB current sources (and all other current sources as well) is fixed and constant. The mismatch in the current sources then gives some particular level of INL for each die. Applying the present invention including optimizing current source matching will require additional circuitry in to be included on the die for allowing an arbitrary sequence or order of use of the thirty-one MSB current sources to be set after fabrication of the die. For a CMOS DAC, for example, a network of switches in the digital decoding section of the DAC may be provided to access the individual current sources as shown schematically in the upper 5-bit decoder 18 (FIG. 1). In other words, logic in the decoder 18 provides an example of access means to facilitate measuring the individual currents. Of course, the value of each current source can be determined by selectively operating the DAC inputs and calculating the current value from a given current source based upon the output current and the previous output current(s).

After fabrication and at final package test, each of the thirty-one MSB current sources is individually measured (which is inherently easy for DACs) and then the values are sorted from lowest to highest. Now each current source value is known and the order of use from one to thirty-one can be programmed using the connection network 35.

Figure 4:
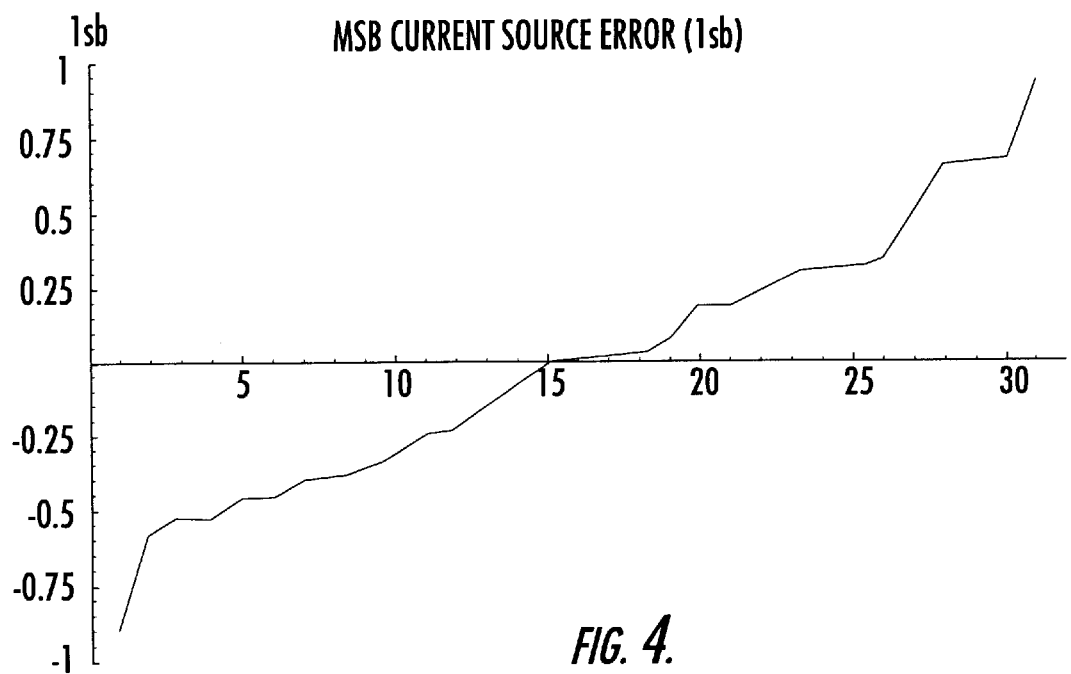
FIG. 4 is a plot of MSB current source error for a sorted configuration of MSB current sources to illustrate the principles of the present invention.

A Mathematica simulation was used to model the statistical nature of the realized current sources and the reordering scheme and resulting effect on INL. If the thirty-one current sources are arranged from lowest to highest current value, then the sorted current source values can be plotted as a current error in terms of a 14 bit LSB relative to the mean value as shown in FIG. 4. This plot is the result of one particular set of current sources using the Mathematica routines as will be readily appreciated by those skilled in the art.

The optimal INL results from a reordered sequence which begins with an MSB current source that has an error from the mean value of about half of the amount of the most negative error, then followed by the current source with the most positive error. Now the remaining sources are ordered so that the error alternates from negative to positive and the magnitude of the error decreases from largest to smallest and then back from smallest to largest. Finally, the last current source to be used is again one that has an error of about half of the most negative error. Based on the plot of FIG. 4 and the sorted sources from 1 to 31, the order would be:

7, 31, 1, 29, 3, 27, 5, 25, 9, 23, 11, 21, 13, 19, 15, 17 16, 18, 14, 20, 12, 22, 10, 24, 6, 26, 4, 28, 2, 30, 8.

Note that 7 has a negative error of about half the magnitude of the most negative which is 1. Next comes 31 which has the largest positive error, 1 has the largest negative error, then 29 has positive, 3 negative and so on. Every other MSB current source is used so that when current sources 15 and 17, the ones with the smallest error magnitudes are used, the sequence can be continued using sources which have gradually larger magnitudes. This happens with current sources 16, 18, etc. The error sign is still alternating between positive and negative. Finally, MSB current source 8 is used which again has about half of the error of the most negative. The sequence can also be ordered using a first and last source having a positive error of about half of the maximum positive error, again alternating positive and negative, with the same overall result.

Figure 5:
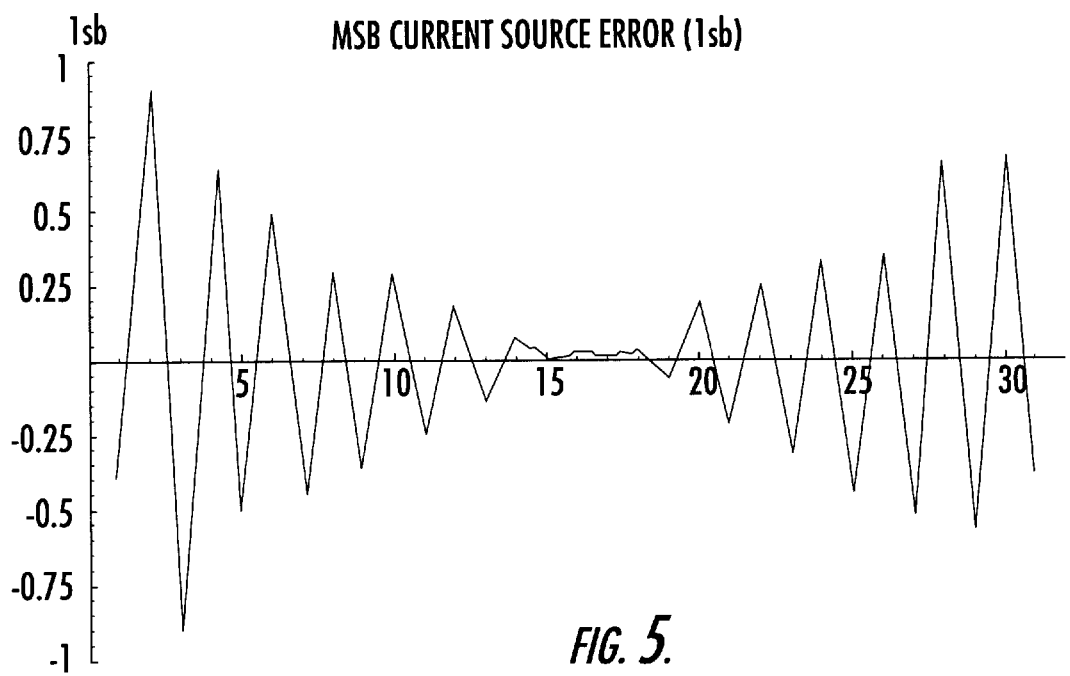
FIG. 5 is a plot of MSB current source error for a predetermined sequence of use to enhance performance of the DAC in accordance with the present invention.

This results in an ordering of current sources giving errors, again in 14 bit LSB, as shown in FIG. 5. It is this order of current sources that is then programmed permanently on the die using the connection network 35.

This basic method of sorting and reordering to optimize INL was applied as described to the thirty-one MSB current sources and the fifteen mid MSB current sources using the Mathematica routines. In addition, the most accurate fifteen of the sixteen mid MSB current sources were selected and reordered. This method of choosing the best one of the thirty-two MSB current sources for the mid MSB current sources after fabrication of the die will always give a better INL result when compared to the prior art practice of designing a particular and fixed current source grouping.

Figure 6:
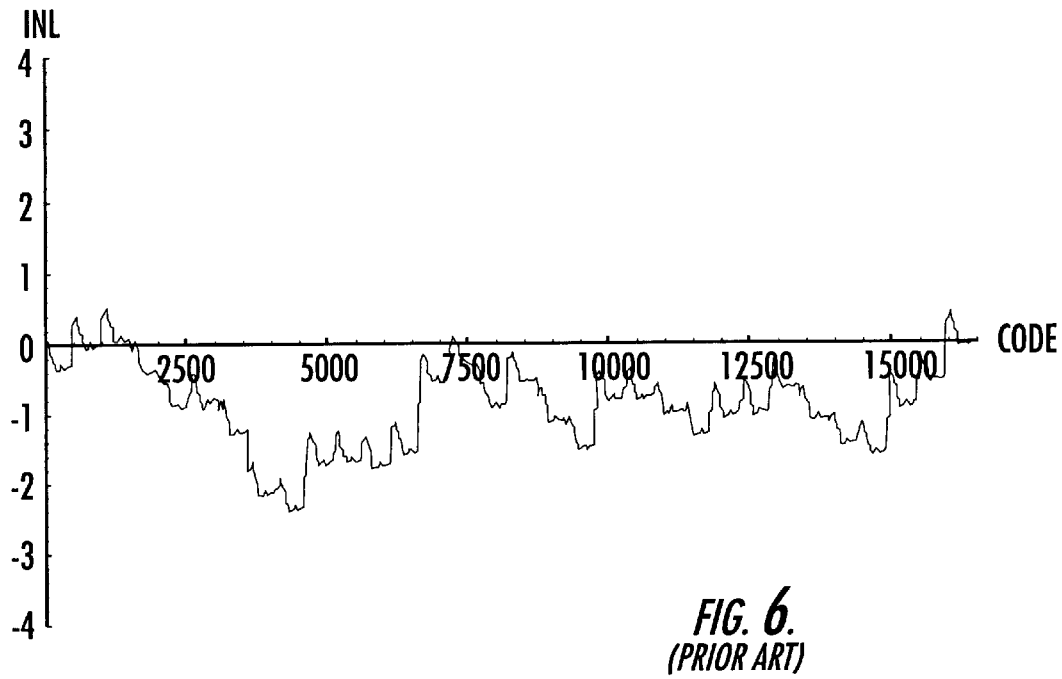
FIG. 6 is a plot of INL for a DAC in accordance with the prior art.
Figure 7:
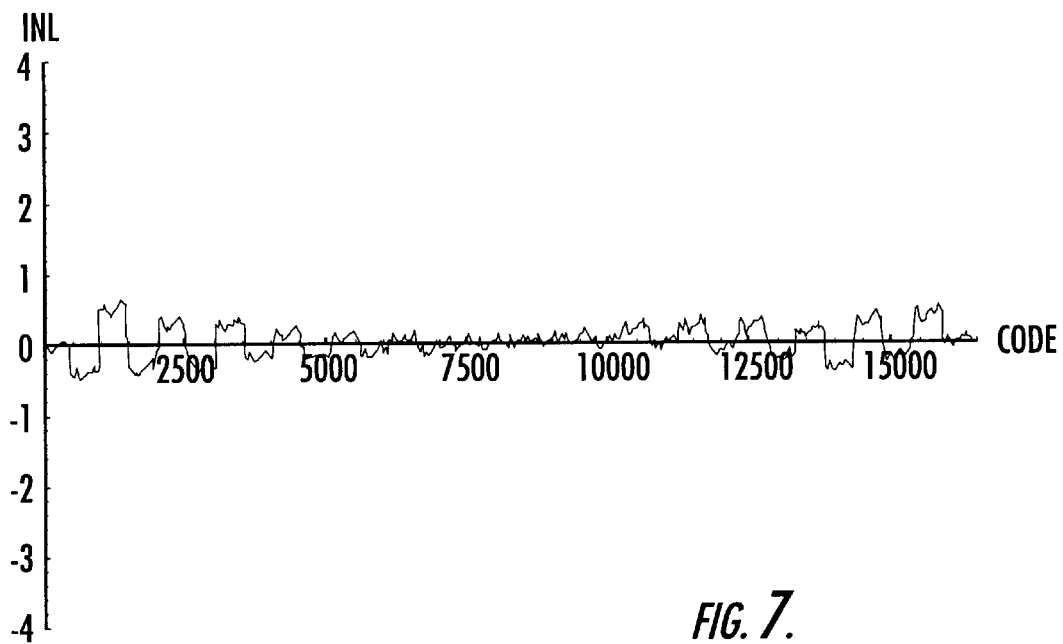
FIG. 7 is a plot of INL for a DAC in accordance with the present invention.

A plot of the INL for one particular die which shows typical INL characteristics for the prior art with a fixed order of use of the current sources is shown in FIG. 6. In contrast, FIG. 7 is a plot of the INL which results after optimizing the current source matching as applied to the same die. The best fit INL for the prior art plot is about 1.5 LSB. In accordance with the present invention, the same die gives a best fit INL of 0.47 LSB.

The Mathematica routine was also used to record die yield results for varying INL limits. The data in Table 1 represents fifty die. Each die has its INL calculated first using the prior art architecture. Next the optimizing reordering of the invention is applied as described to the same die and the INL again calculated. The resulting yields for the prior art and in accordance with the invention to different INL test limits were recorded and appear in the table. Using the invention, the INL achieved can be improved from just over 2.0 LSB to better than 1.0 LSB with no yield loss.

TABLE 1

Die Yield Due to DAC INL

| INL Limit (In 14 bit LSBs) | Die Yield | |
| --- | --- | --- |
| | Prior art DAC architecture | sorted/reordered DAC architecture |
| 0.5 lsb | 0% | 12% |
| 1.0 lsb | 6% | >99% |
| 1.5 lsb | 66% | >99% |
| 2.0 lsb | 96% | >99% |
| 2.5 lsb | 98% | >99% |
| 3.0 lsb | >99% | >99% |

The plurality of current sources have actual values sortable from lowest to highest, and each actual current value will define an error value with both a magnitude and polarity relative to the desired value. One embodiment for sorting the order of use of the current sources is based upon the error values. In other words, in one embodiment, the connection network 35 establishes a predetermined sequence of use of the current sources defining a first current source with a first polarity and an error magnitude of about half a highest or largest error magnitude, followed by a second current source having a second polarity and a highest magnitude, with the remaining current sources ordered so that the error alternates from the first polarity to the second polarity and the magnitude of the error decreases from largest to smallest and then back again from smallest to largest. A last current source has about half a highest or largest magnitude of error and the first polarity.

As will be readily appreciated by those skilled in the art, in other embodiments of the DAC, other parameters may be enhanced. For example, the DNL can be minimized by ordering the current sources, again after individual measurement of the sources after die fabrication, such that the change in the output for each unit digital input change is equalized over the entire range of digital inputs to the maximum extent possible for each die. In other words, to reduce DNL, the current sources could be ordered from smallest to largest, or largest to smallest as will be appreciated by those skilled in the art. Of course, a designer may wish to improve both INL and DNL. One such sequence which improves both is:

16, 20, 24, 28, 30, 26, 22, 18, 14, 10, 6, 3, 1, 5, 9, 13, 17, 21, 25, 29, 31, 27, 23, 19, 15, 11, 7, 2, 4, 8, 12

Those of skill in the art will appreciate many other possible sequences. This ordering can be determined once the individual current sources are measured. The permanent interconnection or combination of the individual current sources can be done at either the die level or at final package test as a fully assembled unit as will also be appreciated by those skilled in the art.

Figure 8:
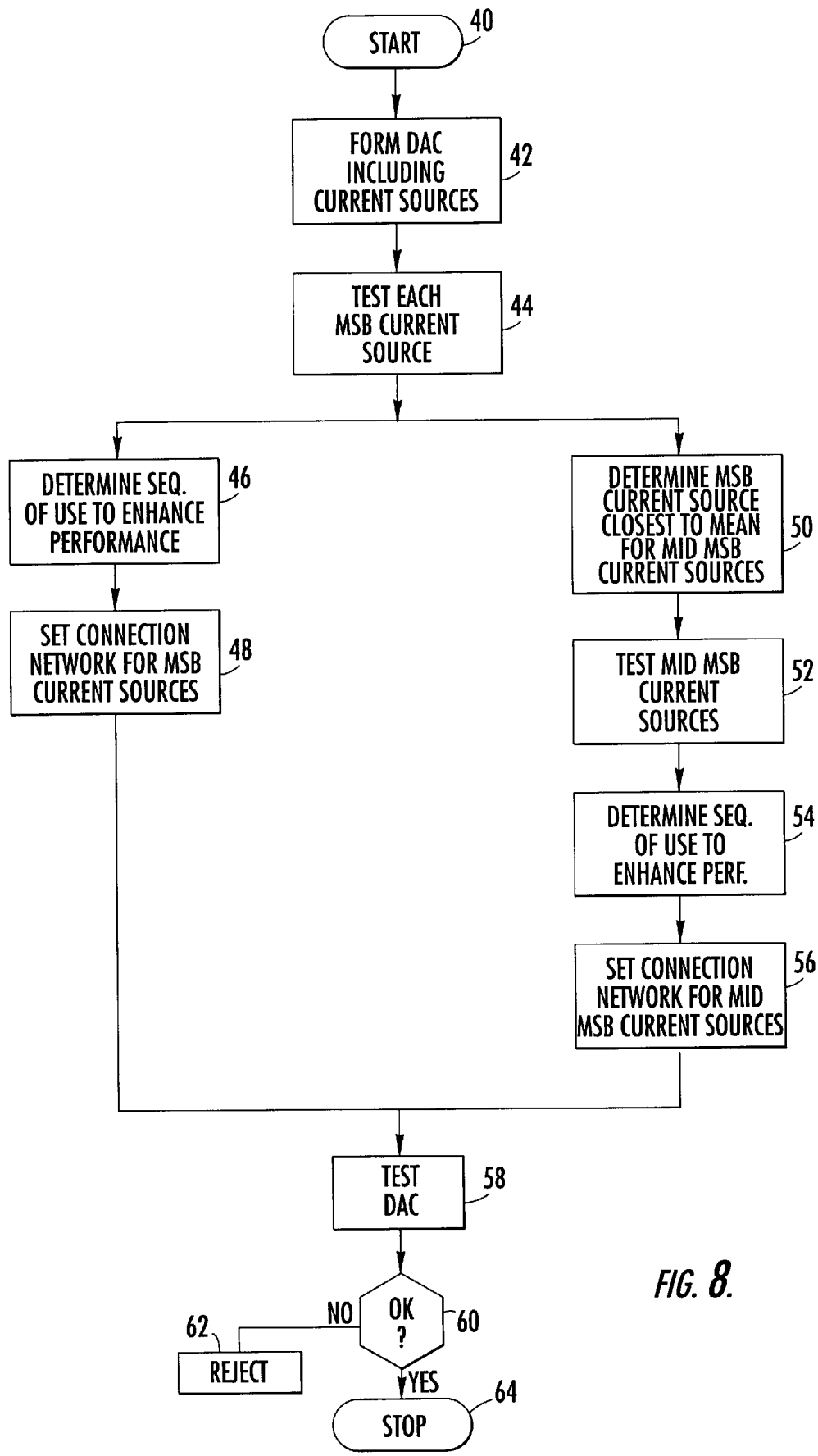
FIG. 8 is a flow chart of a method in accordance with the invention.

Turning now to the flow chart of FIG. 8, the method aspects of the invention are reviewed. The method is directed to making a DAC, such as described above. In particular, from the start (Block 40) the DAC is formed including the MSB and mid MSB current sources at Block 42. Of course, many individual circuit die, each including the DAC, are formed at one time on the semiconductor wafer as will be appreciated by those skilled in the art. Each current source is measured to determine its actual current value at Block 44. At Block 46 the actual current values of the MSB current sources may be sorted, and the optimum sequence of use determined as explained in detail above.

In addition, an MSB current source having a value closest to the mean may be determined at Block 50. This MSB current source will include sixteen individual current sources for the mid MSBs. Accordingly, at Block 52 each of the sixteen mid MSB current sources can be tested or measured to determined the most accurate fifteen therefrom. At Block 54 the sequence of use of the mid MSB current sources is determined also to enhance performance.

At Block 48 the connection network is set to use the predetermined sequence of use of the thirty-one MSB current sources. Similarly, at Block 56 the connection network is set to sequentially use the fifteen mid MSB current sources in the desired order of use. Thereafter, at Block 58 the DAC may be tested, and if acceptable (Block 60) the DAC is useable and the testing stops (Block 64). Of course, if the DAC fails the testing at Block 60 then the DAC is rejected (Block 62).

Those of skill in the art will appreciate that the techniques disclosed herein for enhancing performance of the DAC may be used for only the MSB current sources, for both MSB and mid MSB current sources, or in some embodiments just for the mid MSB current sources. Moreover, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A digital-to-analog converter (DAC) comprising:
   a substrate;
   a plurality of current sources on said substrate operable in a predetermined sequence of use for generating an output current based upon a digital input, each current source having an actual current value statistically related to a desired current value; and
   a connection network for establishing the predetermined sequence of use for said plurality of current sources based upon the actual current values and to increase performance of the DAC.

2. A DAC according to claim 1 wherein said connection network comprises a plurality of fusible links.

3. A DAC according to claim 1 wherein said plurality of current sources comprise a first group of most significant bit (MSB) current sources for a predetermined number of MSBs.

4. A DAC according to claim 3 wherein the predetermined number of MSBs is N and the first group of MSB current sources are $2^N-1$ in number.

5. A DAC according to claim 3 wherein said plurality of current sources comprise a second group of mid-most significant bit (mid MSB) current sources for a predetermined number of mid MSBs.

6. A DAC according to claim 5 wherein the predetermined number of mid MSBs is M and the second group of mid MSB current sources are $2^M-1$ in number.

7. A DAC according to claim 6 wherein the first group of MSB current sources define a mean MSB current source value; and wherein the second group of mid MSB current sources generates a total current substantially equal to $(2^M-1)/2^M$ times the mean MSB current source value.

8. A DAC according to claim 1 wherein said plurality of current sources have actual values sortable from lowest to highest, and wherein each actual current value defines an error value with both a magnitude and polarity relative to the desired value.

9. A DAC according to claim 8 wherein said connection network establishes the predetermined sequence of use for said plurality of current sources with a first current source having a first polarity and an error magnitude of about half a highest error magnitude, followed by a second current source having a second polarity and a highest magnitude, with the remaining current sources ordered so that the error alternates from the first polarity to the second polarity and the magnitude of the error decreases from largest to smallest and then back again from smallest to largest; and wherein a last current source has about half a highest error magnitude and the first polarity.

10. A DAC according to claim 1 wherein said connection network establishes the predetermined sequence of use for said plurality of current sources to reduce integral non-linearity error of the DAC.

11. A DAC according to claim 1 further comprising access means for accessing each individual current source to facilitate measuring a current value thereof.

12. A digital-to-analog converter (DAC) comprising:
a substrate;
a plurality of current sources on said substrate operable in a predetermined sequence of use for generating an output current based upon a digital input, each current source having an actual current value defining an error value with both a magnitude and polarity relative to a desired value; and
a connection network for establishing the predetermined sequence of use for said plurality of current sources based upon the error values and to decrease an integral non-linearity error (INL) for the DAC.

13. A DAC according to claim 12 wherein said connection network comprises a plurality of fusible links.

14. A DAC according to claim 12 wherein said plurality of current sources comprise a first group of most significant bit (MSB) current sources for a predetermined number of MSBs.

15. A DAC according to claim 14 wherein the predetermined number of MSBs is N and the first group of MSB current sources are $2^N-1$ in number.

16. A DAC according to claim 14 wherein said plurality of current sources comprise a second group of mid-most significant bit (mid MSB) current sources for a predetermined number of mid MSBS.

17. A DAC according to claim 16 wherein the predetermined number of mid MSBs is M and the second group of mid MSB current sources are $2^M-1$ in number.

18. A DAC according to claim 17 wherein the first group of MSB current sources define a mean MSB current source value; and wherein the second group of mid MSB current sources generates a total current substantially equal to $(2^M-1)/2^M$ times the mean MSB current source value.

19. A DAC according to claim 12 wherein said connection network establishes the predetermined sequence of use for said plurality of current sources with a first current source having a first polarity and an error magnitude of about half a highest error magnitude, followed by a second current source having a second polarity and a highest magnitude, with the remaining current sources ordered so that the error alternates from the first polarity to the second polarity and the magnitude of the error decreases from largest to smallest and then back again from smallest to largest; and wherein a last current source has about half a highest error magnitude and the first polarity.

20. A DAC according to claim 12 further comprising access means for accessing each individual current source to facilitate measuring a current value thereof.

21. A digital-to-analog converter (DAC) comprising:
a substrate;
a first group of most significant bit (MSB) current sources for a predetermined number of MSBs on said substrate operable in a predetermined sequence of use for generating an output current based upon a digital input, each MSB current source having an actual current value statistically related to a desired current value; and
a connection network for establishing the predetermined sequence of use for said MSB current sources based upon the actual current values and to increase performance of the DAC.

22. A DAC according to claim 21 wherein said connection network comprises a plurality of fusible links.

23. A DAC according to claim 21 wherein the predetermined number of MSBs is N and the first group of MSB current sources are $2^N-1$ in number.

24. A DAC according to claim 21 further comprising a second group of mid-most significant bit (mid MSB) current sources for a predetermined number of mid MSBs; and wherein said connection network is also for establishing a predetermined sequence of use of said mid MSB current sources.

25. A DAC according to claim 24 wherein the predetermined number of mid MSBs is M and the second group of mid MSB current sources are $2^M-1$ in number.

26. A DAC according to claim 25 wherein the first group of MSB current sources define a mean MSB current source value; and wherein the second group of mid MSB current sources generates a total current substantially equal to $(2^M-1)/2^M$ times the mean MSB current source value.

27. A DAC according to claim 21 wherein said MSB current sources have actual values sortable from lowest to highest, and wherein each actual current value defines an error value with both a magnitude and polarity relative to the desired value.

28. A DAC according to claim 27 wherein said connection network establishes the predetermined sequence of use for said plurality of MSB current sources with a first MSB current source having a first polarity and an error magnitude of about half a highest error magnitude, followed by a second MSB current source having a second polarity and a highest magnitude, with the remaining MSB current sources ordered so that the error alternates from the first polarity to the second polarity and the magnitude of the error decreases from largest to smallest and then back again from smallest to largest; and wherein a last MSB current source has about half a highest error magnitude and the first polarity.

29. A DAC according to claim 21 wherein said connection network establishes the predetermined sequence of use for said first group of MSB current sources to reduce integral non-linearity error of the DAC.

30. A DAC according to claim 21 further comprising access means for accessing each individual MSB current source to facilitate measuring a current value thereof.

31. A method for making a digital-to-analog converter (DAC) comprising the steps of:

forming a plurality of current sources on a substrate operable in a predetermined sequence of use for generating an output current based upon a digital input, each current source having an actual current value statistically related to a desired current value;

determining the predetermined sequence of use for the plurality of current sources based upon the actual current values and to increase performance of the DAC; and setting a connection network to establish the predetermined sequence of use for the plurality of current sources.

32. A method according to claim 31 wherein the step of setting the connection network comprises setting a plurality of fusible links.

33. A method according to claim 31 wherein the step of forming the plurality of current sources comprises forming a first group of most significant bit (MSB) current sources for a predetermined number of MSBs.

34. A method according to claim 33 wherein the predetermined number of MSBs is N and the first group of MSB current sources are $2^N-1$ in number.

35. A method according to claim 33 wherein the step of forming the plurality of current sources comprises forming a second group of mid-most significant bit (mid MSB) current sources for a predetermined number of mid MSBS.

36. A method according to claim 35 wherein the predetermined number of mid MSBs is M and the second group of mid MSB current sources are $2^M-1$ in number.

37. A method according to claim 36 wherein the first group of MSB current sources define a mean MSB current source value; and wherein the step of determining comprises determining the second group of mid MSB current sources to generate a total current substantially equal to $(2^M-1)/2^M$ times the mean MSB current source value.

38. A method according to claim 31 wherein each actual current value defines an error value with both a magnitude and polarity relative to the desired value; and wherein the step of determining comprises determining the predetermined sequence of use for the plurality of current sources to set a first current source having a first polarity and an error magnitude of about half a highest error magnitude, followed by a second current source having a second polarity and a highest magnitude, with the remaining current sources ordered so that the error alternates from the first polarity to the second polarity and the magnitude of the error decreases from largest to smallest and then back again from smallest to largest; and wherein a last current source has about half a highest error magnitude and the first polarity.

39. A method according to claim 31 wherein the step of determining comprises determining the predetermined sequence to reduce integral non-linearity error of the DAC.

40. A method according to claim 31 wherein the step of determining comprises measuring an actual current value for each current source.

* * * * *